(12) United States Patent
Anderson et al.

(10) Patent No.: US 7,671,442 B2
(45) Date of Patent: Mar. 2, 2010

(54) AIR-GAP INSULATED INTERCONNECTIONS

(75) Inventors: Brent A. Anderson, Jericho, VT (US);
Andres Bryant, Underhill, VT (US);
Jeffrey P. Gambino, Westford, VT (US);
Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 11/772,899

(22) Filed: Jul. 3, 2007

(65) Prior Publication Data

US 2007/0252282 A1    Nov. 1, 2007

Related U.S. Application Data

(62) Division of application No. 10/711,394, filed on Sep. 16, 2004, now Pat. No. 7,285,474.

(51) Int. Cl.
*H01L 29/00* (2006.01)
(52) U.S. Cl. .................. 257/522; 257/758; 257/276; 438/421; 438/422
(58) Field of Classification Search ............. 257/758, 257/522, 276, E29.02, E29.001, E29.088; 438/421–422
See application file for complete search history.

(56) References Cited

U.S. PATENT DOCUMENTS

| | | | |
|---|---|---|---|
| 5,534,731 | A | 7/1996 | Cheung |
| 5,548,159 | A | 8/1996 | Jeng |
| 5,708,303 | A | 1/1998 | Jeng |
| 6,078,088 | A | 6/2000 | Buynoski |
| 6,211,561 | B1 | 4/2001 | Zhao |
| 6,228,770 | B1 | 5/2001 | Pradeep et al. |
| 6,261,942 | B1 | 7/2001 | Zhou et al. |
| 6,287,979 | B1 | 9/2001 | Zhou et al. |
| 6,465,339 | B2 | 10/2002 | Brankner et al. |
| 6,492,732 | B2 | 12/2002 | Lee et al. |
| 6,908,829 | B2 * | 6/2005 | Hussein et al. ............ 438/421 |
| 2002/0158337 | A1 * | 10/2002 | Babich et al. ............ 257/758 |

* cited by examiner

*Primary Examiner*—Theresa T Doan
(74) *Attorney, Agent, or Firm*—Schmeiser, Olsen & Watts; Richard M. Kotulak

(57) ABSTRACT

Air-gap insulated interconnection structures and methods of fabricating the structures, the methods including: forming a dielectric layer on a substrate; forming a capping layer on a top surface of the dielectric layer; forming a trench through the capping layer, the trench extending toward said substrate and into but not through, the dielectric layer; forming a sacrificial layer on opposing sidewalls of the trench; filling the trench with a electrical conductor; and removing a portion of the sacrificial layer from between the electrical conductor and the dielectric layer to form air-gaps.

20 Claims, 14 Drawing Sheets

AIR-GAP INSULATED INTERCONNECTIONS

This Application is a divisional of U.S. patent application Ser. No. 10/711,394 filed on Sep. 16, 2004.

FIELD OF THE INVENTION

The present invention relates to the field of integrated circuits; more specifically, it relates to air-gap insulated interconnection structures and methods of fabricating air-gap insulated interconnection structures for integrated circuits.

BACKGROUND OF THE INVENTION

Integrated circuits comprise active components such as transistors formed in a semiconductor substrate that are wired together to form integrated circuits. The wiring together is accomplished in interconnect levels. Interconnect levels include electrically conductive lines embedded in a dielectric layer with vias connecting the conductive wires in a particular interconnect level to conductive wires in higher or lower interconnect levels or to the active devices.

As integrated circuit size decreases and density increases, the distance between these conductive lines, especially in the same level, decreases. As the spacing between adjacent conductive lines decreases, the resistive-capacitive (RC) coupling induced in one line by a signal in an adjacent line increases, often to the point of negating increases in performance expected by increasing conductive wire density.

Therefore, there is a need for interconnection structures and methods of fabricating interconnection structures that are less sensitive to RC delay.

SUMMARY OF THE INVENTION

A first aspect of the present invention is a method, comprising: forming a dielectric layer on a substrate; forming a capping layer on a top surface of the dielectric layer; forming a trench through the capping layer, the trench extending toward the substrate and into but not through, the dielectric layer; forming a sacrificial layer on opposing sidewalls of the trench; filling the trench with a electrical conductor; and removing a portion of the sacrificial layer from between the electrical conductor and the dielectric layer to form air-gaps.

A second aspect of the present invention is a structure, comprising: a dielectric layer on a substrate; the capping layer formed on a top surface of the dielectric layer; a damascene or dual damascene wire extending below the top surface of the dielectric layer, a top surface of the damascene or dual damascene wire coplanar with a top surface of a capping layer; a first air-gap between sidewalls of the a damascene or dual damascene wire and the capping layer and a second air-gap between the sidewalls of the damascene or dual damascene wire and the dielectric layer, the first air-gap and the second air gap contiguous to each other; and a sealing layer on the top surface of the damascene or dual damascene wire and the top surface of the capping layer, the sealing layer bridging across and sealing a top of the first air-gap.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The present invention utilizes interconnect structures formed by damascene and dual damascene processes. A damascene process is one in which wire trench or via openings are formed in a dielectric layer, an electrical conductor deposited on a top surface of the dielectric of sufficient thickness to fill the trenches and a chemical-mechanical-polish (CMP) process performed to remove excess conductor and make the surface of the conductor co-planer with the surface of the dielectric layer to form a damascene wires (or damascene vias).

A dual damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor is deposited on a top surface of the dielectric of sufficient thickness to fill the trenches and via opening and a CMP process performed to make the surface of the conductor in the trench co-planer with the surface the dielectric layer to form dual damascene wire and dual damascene wires having integral dual damascene vias. For the purposes of the present invention the term wire is equivalent to the terms damascene and dual damascene wire unless otherwise stated.

Reduction of RC delay (which is a function of the dielectric constant of the dielectric material between the wires, the lower the dielectric constant, the lower the RC delay) is accomplished in the present invention by the use of a sacrificial sidewall layer around wires which can be removed forming air-gaps and provide access to the dielectric layer which can be removed to form wider or extended air-gaps in the dielectric layer between wires on the same interconnect level. The RC delay is reduced because air has a lower dielectric constant than most solid dielectric materials.

For the purposes of the present invention, the term air-gap includes enclosed voids filled with air, inert gases or partial vacuums containing air or inert gases. The term gap implies an opening in a layer filled with the ambient atmosphere.

Figure 1A:
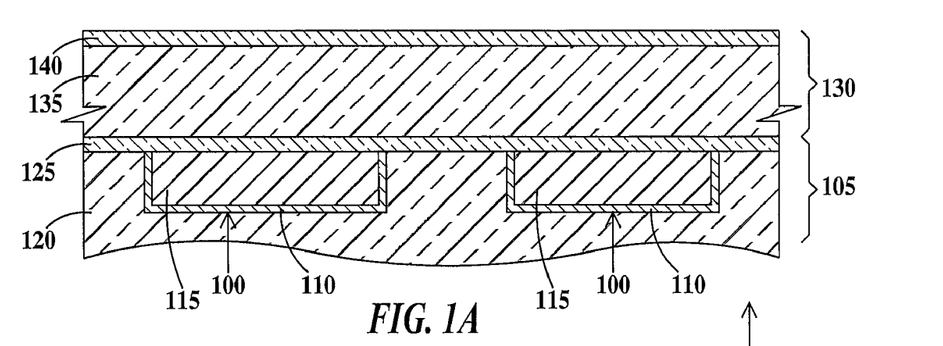
FIGS. 1A through 1G are partial cross-sectional views illustrating fabrication of an interconnect structure according to a first embodiment of the present invention.

FIGS. 1A through 1G are partial cross-sectional views illustrating fabrication of an interconnect structure according to a first embodiment of the present invention. In FIG. 1A, wires 100 are formed in a first interconnect level 105. Wires 100 include conductive liners 110 and core conductors 115. In one example core conductors 110 are copper and conductive liners 115 comprise a dual layer of tantalum and tantalum nitride, with the tantalum layer between the copper and the tantalum nitride layer. Alternatively, wires 100 may be stud (formed from, for example as tungsten) which connect to devices, such as transistors, formed in a silicon layer (not shown) under first interconnect level 105.

First interconnect level 105 includes a dielectric layer 120 (in which wires 100 are embedded) and a capping layer 125 in contact with and covering wires 100 and dielectric layer 120. Capping layer 125 may act as a copper diffusion barrier. In one example dielectric layer 120 is a low dielectric constant (low K) material, examples of which include but are not limited to hydrogen silsesquioxane polymer (HSQ), methyl silsesquioxane polymer (MSQ), SiLK™ (poly(arylene) ether) manufactured by Dow Chemical, Midland, Tex., BLACK DIAMOND™ (methyl doped silica) or $(SiO_x(CH3)_y)$ or $(SiC_xOyH_z)$ or (SiCOH) manufactured by Applied Materials, Santa Clara, Calif. for which SiCOH will be hereafter. For the purposes of the present invention, a low K material is defined as a material having a lower dielectric constant than that of undoped thermal $SiO_2$. Dielectric layer 120 may be, for example, between about 300 nm to about 2,000 nm thick. Examples of capping layer 125 materials include but are not limited to silicon nitride (SiN), silicon carbide (SiC), silicon oxynitride (SiON), silicon carbo nitride (SiCN) and silicon oxycarbide (SiOC). Capping layer 120 may be, for example, about 5 nm to about 200 nm thick.

Formed on top of first interconnect level 105 is a second interconnect level 130. Second interconnect level includes a dielectric layer 135 formed on capping layer 125 and a capping layer 140 in contact with and covering dielectric layer 135. The materials and thicknesses of dielectric layer 135 may be any of the materials and thickness listed supra for dielectric layer 120 and the materials and thicknesses of capping layer 140 may be any of the materials and thickness listed supra for capping layer 125.

Figure 1B:
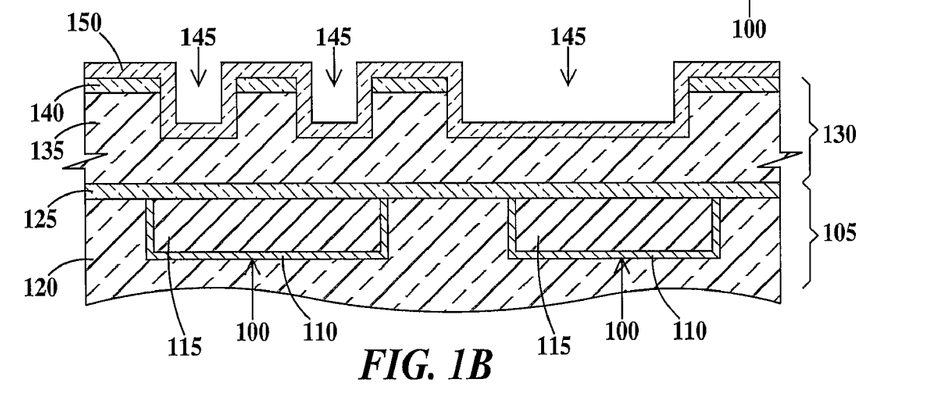

In FIG. 1B, wire trenches 145 are formed completely through capping layer 140 and partially through dielectric layer 135 by any number of reactive ion etch (RIE) processes known in the art. A conformal sacrificial layer 150 comprises formed on the sidewalls and bottoms of wire trenches 145 and exposed capping layer 140. In one example, sacrificial layer 150 comprises $SiO_2$ formed by plasma enhanced chemical vapor deposition (PECVD) and is between about 5 nm to about 300 nm thick.

Figure 1C:
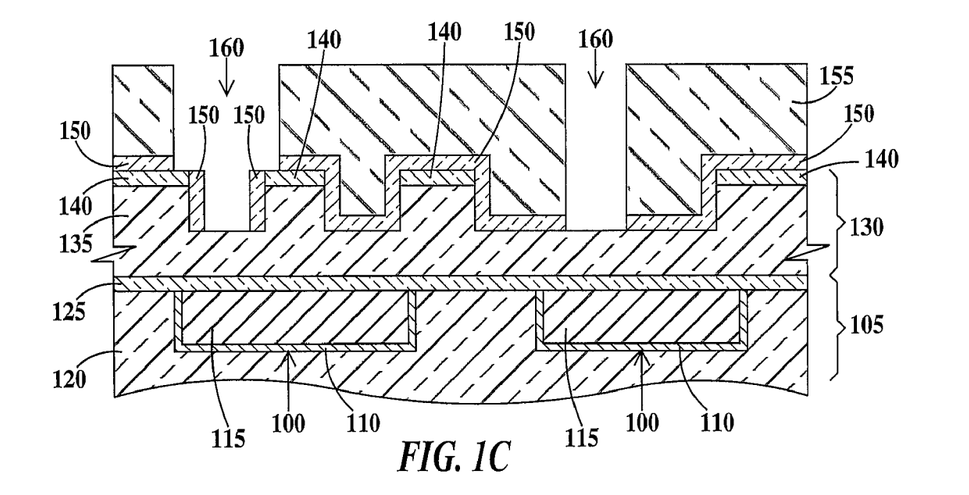

In FIG. 1C, a photoresist layer 155 is formed over sacrificial layer 150 and openings 160 formed in the photoresist layer exposing the sacrificial layer in the bottom of the openings. The thus exposed sacrificial layer 150 comprises removed by selective RIE etching from the bottom of openings 160 to expose dielectric layer 135. For example, if dielectric layer 135 comprises SiLK™ and sacrificial layer 150 comprises $SiO_2$, sacrificial layer 150 may be RIE etched using $CF_4$ or other another F based gas, which selectively etches $SiO_2$ over SiLK™.

Figure 1D:
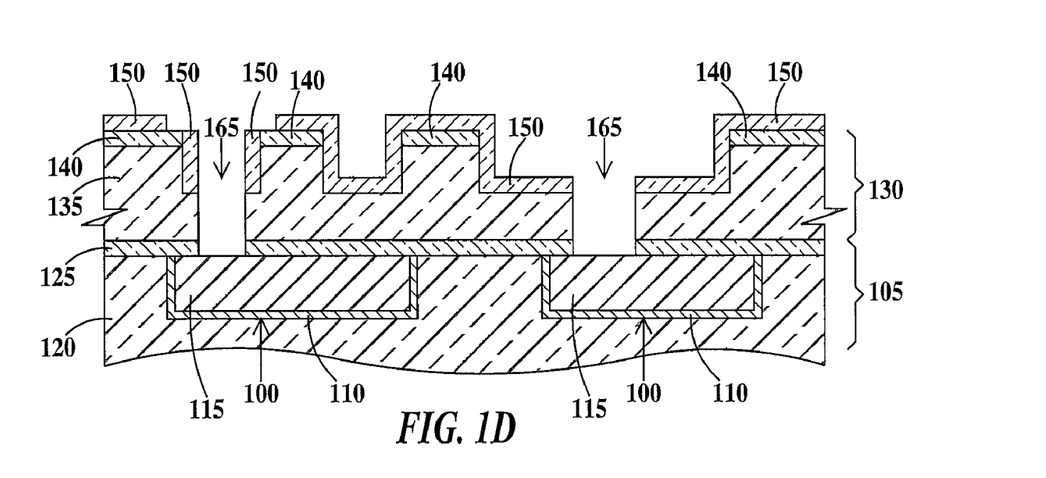

In FIG. 1D, resist layer 155 (see FIG. 1C) is removed and via openings 165 formed by selective RIE through remaining dielectric layer 135 and capping layer 125 to expose wires 100 in the bottom of the via openings. In one example, if dielectric layer 135 comprises SiLK™ and capping layer 125 comprises SiC, dielectric layer 135 may be RIE etched using $O_2$, $N_2$, $H_2$ or a mixture thereof, which selectively etches SiLK™ over SiC. If dielectric layer 135 comprises SiCOH, dielectric layer 135 may be RIE etched using $CF_4$.

Figure 1E:
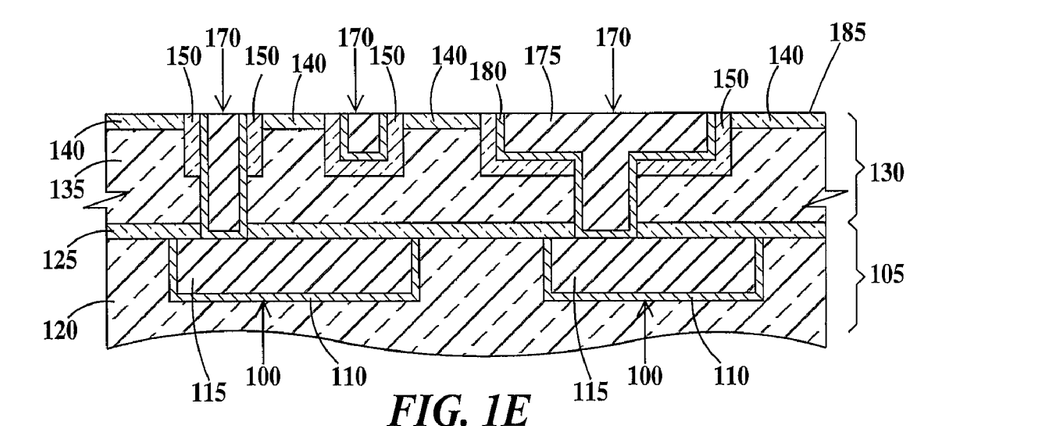

In FIG. 1E, wires 170 are formed. Wires 170 include core conductors 175 and conductive liners 180. In one example core conductors 175 are copper and conductive liners 180 comprise a dual layer of tantalum and tantalum nitride, with the tantalum layer between the copper and the tantalum nitride layer. Wires 170 may be formed by physical vapor deposition (PVD) of TaN, PVD of Ta, sputtering a thin layer of copper, plating a thick layer of copper, and performing a CMP to remove excess TaN, Ta, and copper using capping layer 140 as a polishing stop. Sacrificial layer 150 on top of capping layer 140 is also removed during the CMP. Note, that portions of sacrificial layer 150 are exposed at a surface 185 created by the CMP process.

Figure 1F:
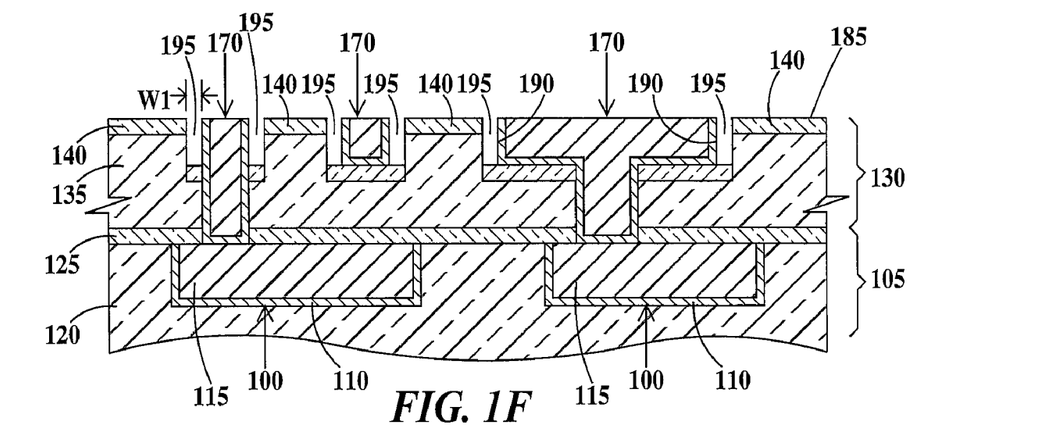

In FIG. 1F, exposed portions of sacrificial layer 150 are recess etched below surface 185 to expose sidewalls 190 of wires 170 and form air-gaps 195 having a width W1. Air gaps 195 each include a first air-gap between capping layer 140 and wires 170 and a contiguous second air-gap between dielectric layer 135 and wires 170, both the first and second air-gaps having about the same width W1. If sacrificial layer 150 comprises $SiO_2$, either an aqueous HF etch or a RIE using, for example $CF_4$, may be used to etch sacrificial layer 150.

Figure 1G:
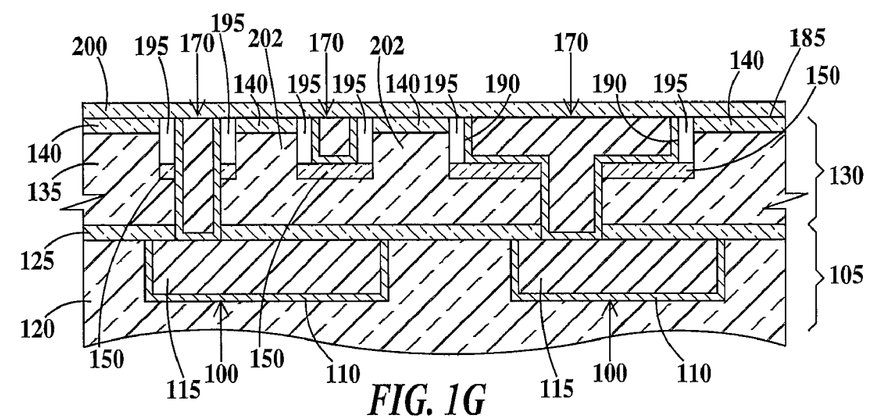

In FIG. 1G, a sealing layer 200 is formed over surface 185, sealing air-gaps 195. Sealing layer 200 may be about (W1 divided by 2) or greater thick to ensure capping layer bridging between capping layer 140 and wires 170. Sealing layer 200 may be made from any of the materials indicated supra for capping layer 140 or capping layer 125. Note that capping layer 140 is supported by pillars 202 of dielectric layer 135. Also, there are un-etched sections of sacrificial layer 150 under wires 170.

Figure 2A:
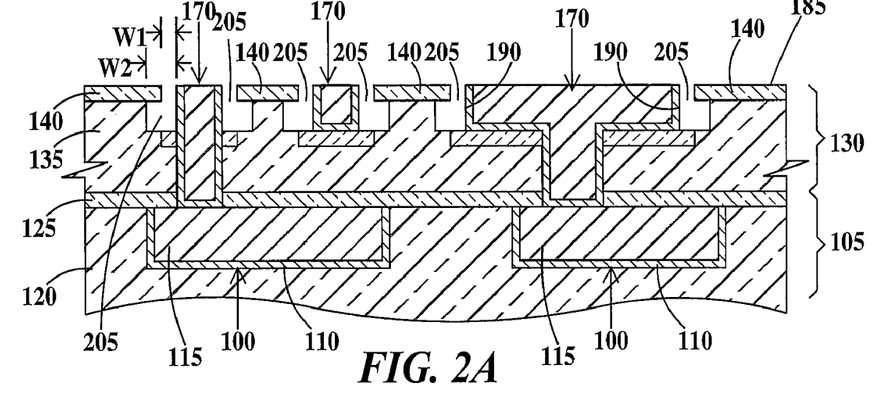
FIGS. 2A and 2B are partial cross-sectional views illustrating fabrication of an interconnect structure according to a second embodiment of the present invention.
Figure 2B:
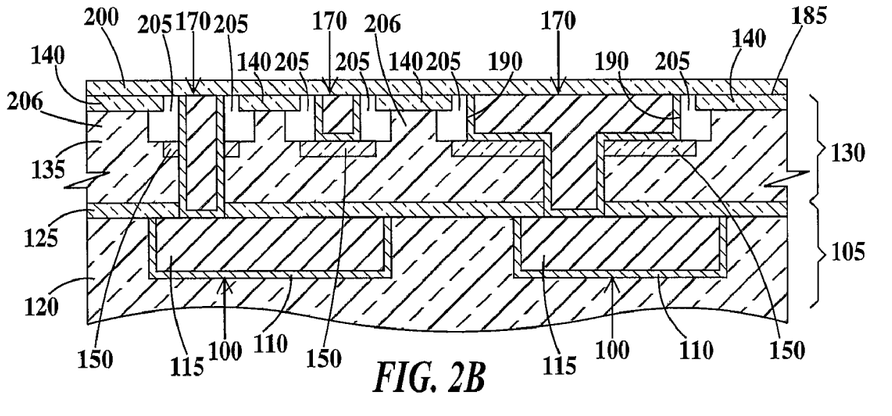

FIGS. 2A and 2B are partial cross-sectional views illustrating fabrication of an interconnect structure according to a second embodiment of the present invention. Since the effectiveness of air-gaps reducing RC delay is a function of the value of W1 (see FIG. 1F), the larger W1, the more effective the reduction. FIG. 2A uses the structure of FIG. 1F as an immediately previous step. In FIG. 2A, dielectric layer 135 is isotropically etched to increase the width of air-gaps 195 from W1 (see FIG. 1F) to form extended air-gaps 205. Extended air gaps 205 each include a first air-gap between capping layer 140 and wires 170 and a contiguous second air-gap between dielectric layer 135 and wires 170, the first air-gaps having widths of about W1 and the second air-gaps having widths of about W2, where W2>W1. If dielectric layer 135 comprises SiLK™, an exemplary etch process is a high pressure, low bias voltage RIE using $O_2$, $N_2$, $H_2$ or a combination thereof.

In FIG. 2B, sealing layer 200 is formed over surface 185, sealing air-gaps 205. Note that capping layer 140 is supported by pillars 206 of dielectric layer 135. Also, there are un-etched sections of sacrificial layer 150 under wires 170.

Figure 3A:
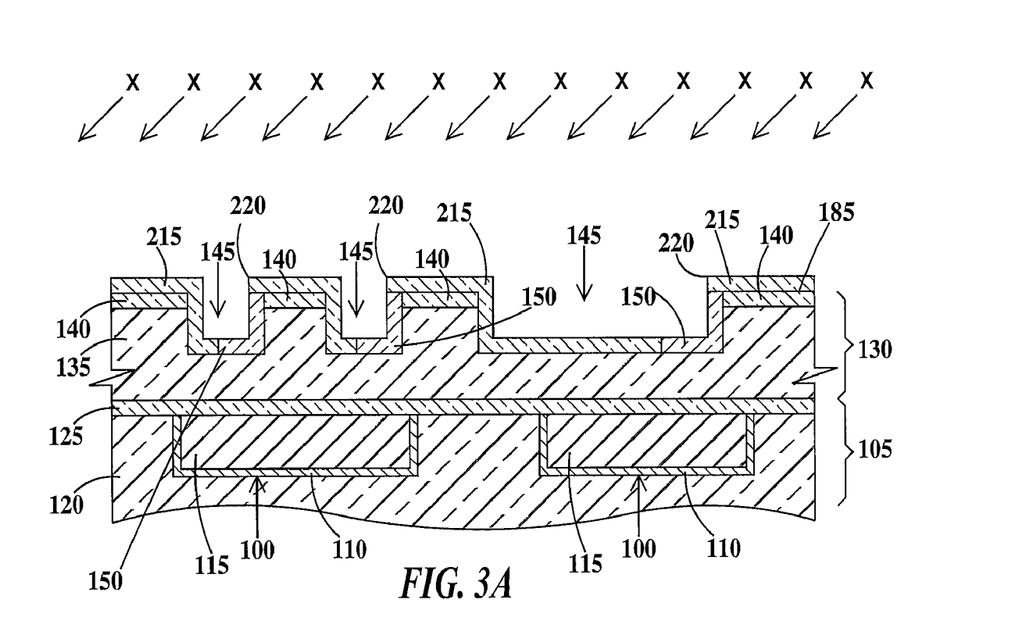
FIGS. 3A through 3G are partial cross-sectional views illustrating fabrication of an interconnect structure according to a third embodiment of the present invention.

FIGS. 3A through 3G are partial cross-sectional views illustrating fabrication of an interconnect structure according to a third embodiment of the present invention. FIG. 3A uses the structure of FIG. 1B as an immediately previous step. In FIG. 3A, an angled ion implant of species X is performed into layer 150, converting portions of sacrificial layer 150 to a sacrificial layer 215 wherever sacrificial layer 150 not shadowed by corners 220 of sacrificial layer 150 formed on corners of trenches 145. In a first example, if sacrificial layer 150 comprises $SIO_2$ and the implanted species X is N at a dose of about $1E^{14}$ atm/cm$^2$ to about $1E^{17}$ atm/cm$^2$, then sacrificial layer 215 comprises SiON containing about 1% to about 50% N. In a second example, if sacrificial layer 150 comprises $SIO_2$ and the implanted species X is C at a dose of about $1E^{14}$ atm/cm$^2$ to about $1E^{17}$ atm/cm$^2$, then sacrificial layer 215 comprises SiOC containing about 1% to about 50% C.

Figure 3B:
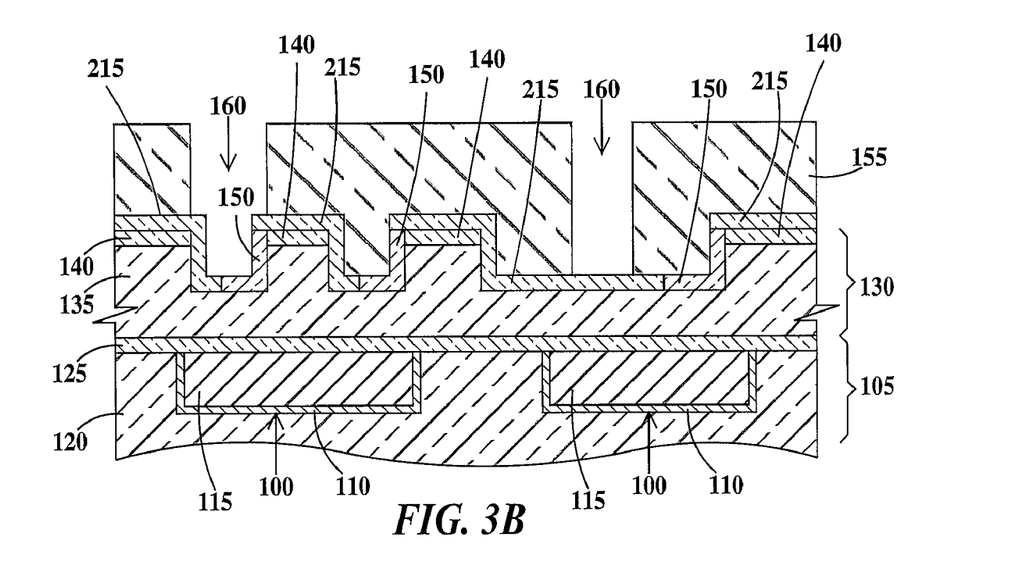

In FIG. 3B, a photoresist layer 155 is formed over sacrificial layers 150 and 215 and openings 160 formed in the photoresist layer exposing sacrificial layer 150 and/or sacrificial layer 215 in the bottom of the openings.

Figure 3C:
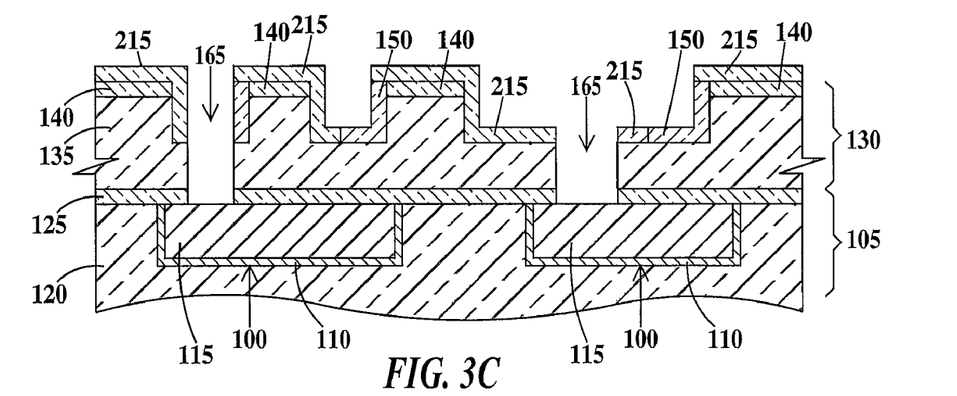

In FIG. 3C, the thus exposed sacrificial layer 150 and/or sacrificial layer 215 comprises removed by selective RIE etching from the bottom of openings 160 to expose dielectric layer 135. Then resist layer 155 (see FIG. 3B) is removed and via openings 165 formed through remaining dielectric layer 135 and capping layer 125 to expose wires 100 in the bottom of the via openings.

Figure 3D:
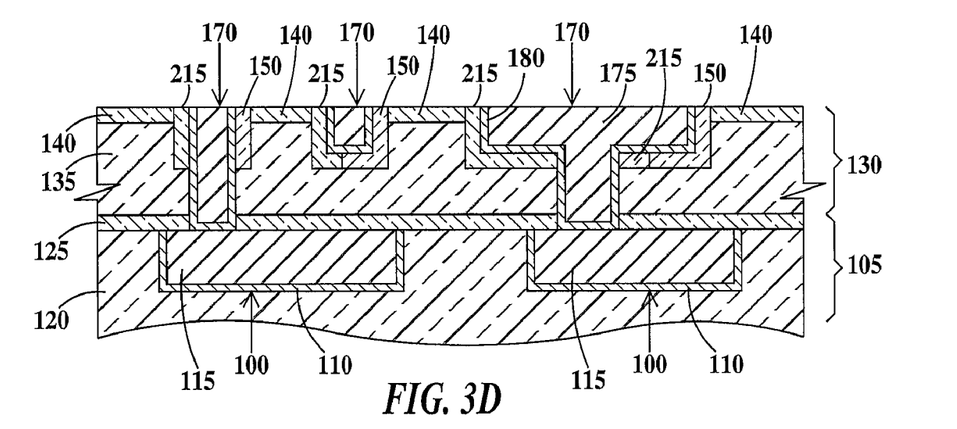

In FIG. 3D, wires 170 are formed. Wires 170 include core conductors 175 and conductive liners 180 as described supra.

Figure 3E:
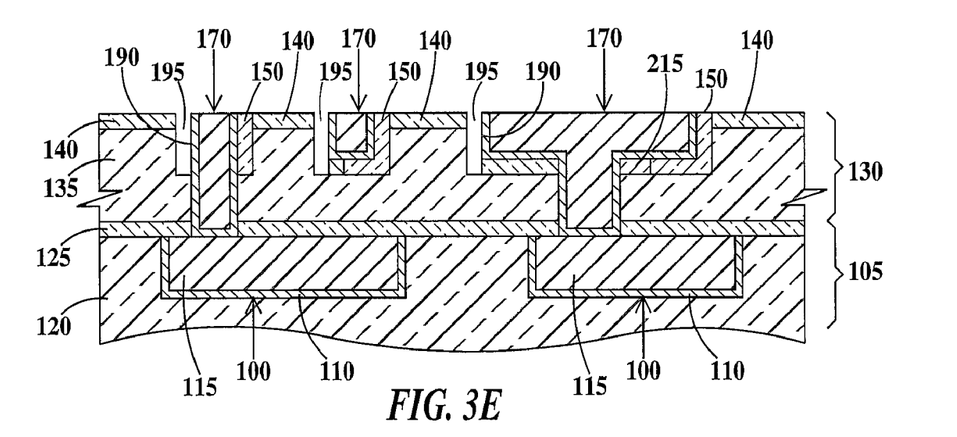

In FIG. 3E, exposed portions of sacrificial layer 215 are recess etched below surface 185 to expose sidewalls 190 of wires 170 and form air-gaps 195. In the example that sacrificial layer 150 comprises $SiO_2$ and sacrificial layer 215 comprises SiON, an RIE etch using $CF_4$ and $O_2$ may be used to etch sacrificial layer 215 selectively to sacrificial layer 150.

Figure 3F:
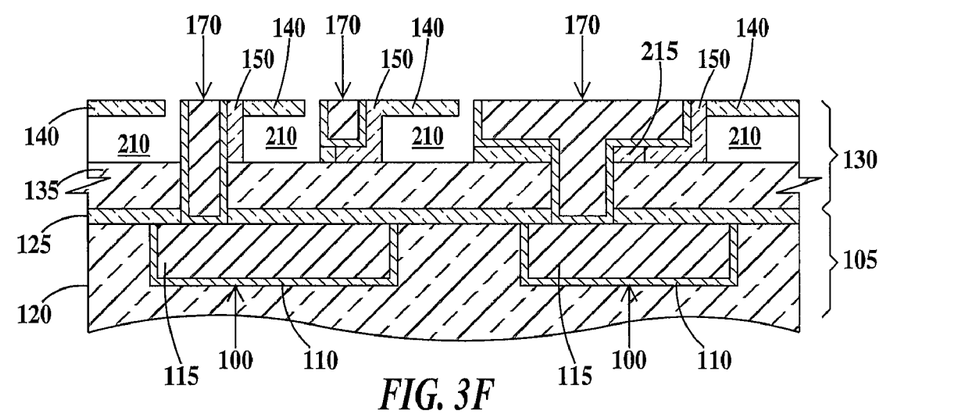

In FIG. 3F, dielectric layer 135 comprises isotropically etched to increase the width of air-gaps 195 thus forming extended air-gaps 210. Extended air gaps 210 each include a first air-gap between capping layer 140 and wires 170 and a contiguous second air-gap between dielectric layer 135 and wires 170, the first air-gaps having less than the width of the second air-gap. Portions of sacrificial layer 150 remain attached to portions of wires 170 and support capping layer 140.

Figure 3G:
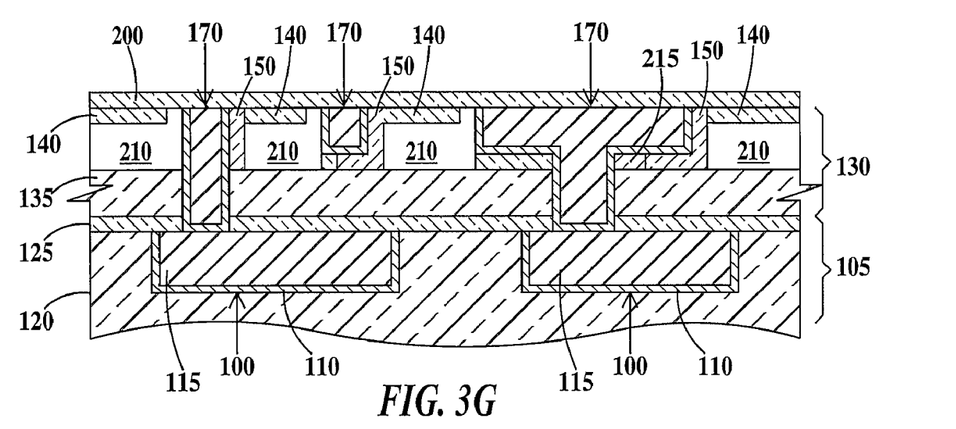

In FIG. 3G, sealing layer 200 is formed over surface 185, sealing air-gaps 210. Note, there are un-etched sections of sacrificial layer 150 under wires 170.

Figure 4A:
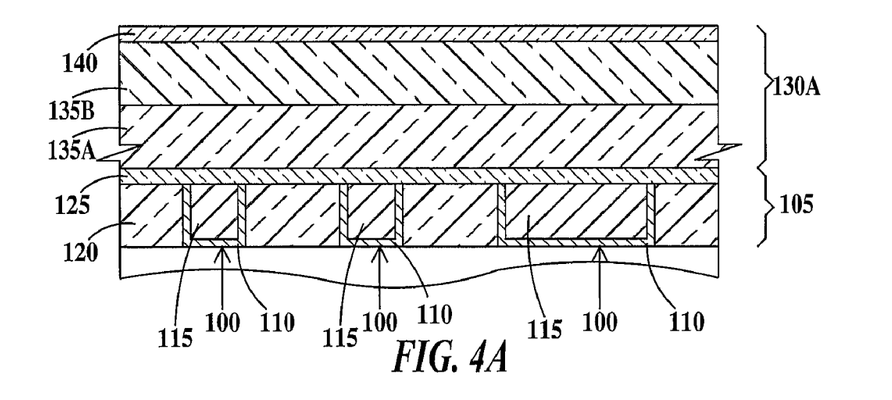
FIGS. 4A through 4K are partial cross-sectional views illustrating fabrication of an interconnect structure according to a fourth embodiment of the present invention.

FIGS. 4A through 4K are partial cross-sectional views illustrating fabrication of an interconnect structure according to a fourth embodiment of the present invention. In FIG. 4A, wires 100 are formed in first interconnect level 105. Wires 100 include core conductors 115 and conductive liners 110. First interconnect level 105 includes dielectric layer 120 (in which wires 100 are embedded) and capping layer 125 in contact with and covering wires 100 and dielectric layer 120. Formed top of first interconnect level 105 is a second interconnect level 130A. Second interconnect level includes a lower dielectric layer 135A formed on capping layer 125, an upper dielectric layer 135B formed on lower dielectric layer 135A and a capping layer 140 in contact with and covering upper dielectric layer 135B. Lower and upper dielectric layers 135A and 135B are different low K materials, examples of which include but are not limited to HSQ, MSQ, SiLK™ and SiCOH. In one example, lower dielectric layer 135A comprises SiCOH between about 200 nm to about 1,500 nm thick, upper dielectric layer 135B comprises SiLK™ between about 200 nm to about thick 1,500 nm and capping layer 140 comprises SiC between about 5 nm to about 200 nm thick.

Figure 4B:
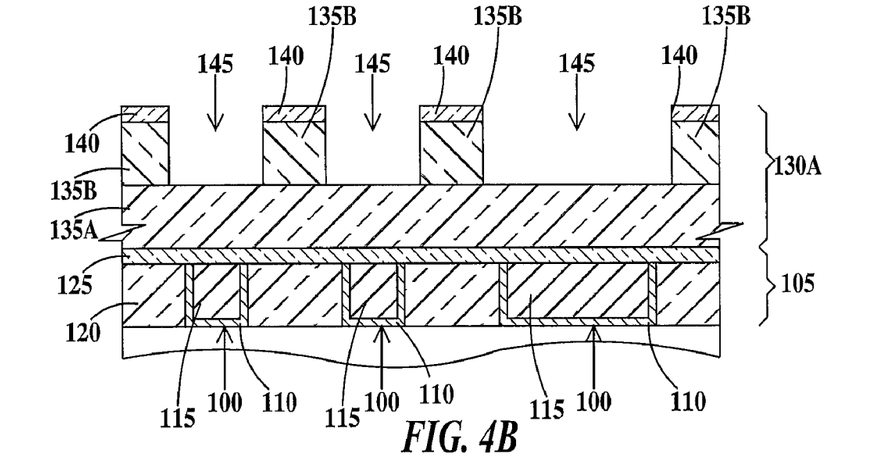

In FIG. 4B, wire trenches 145 are formed completely through capping layer 140 and completely through upper dielectric layer 135B by any number of reactive ion etch (RIE) processes known in the art. RIE processes may be chosen so upper dielectric layer 135B comprises etched selectively to lower dielectric layer 135A. In the example that upper dielectric layer 135B comprises SiLK™ and lower dielectric layer 135A comprises SiCOH, an exemplary etch process for upper dielectric layer 135B comprises a high pressure, low bias voltage RIE using $O_2$, $N_2$, $H_2$ or a combination thereof.

Figure 4C:
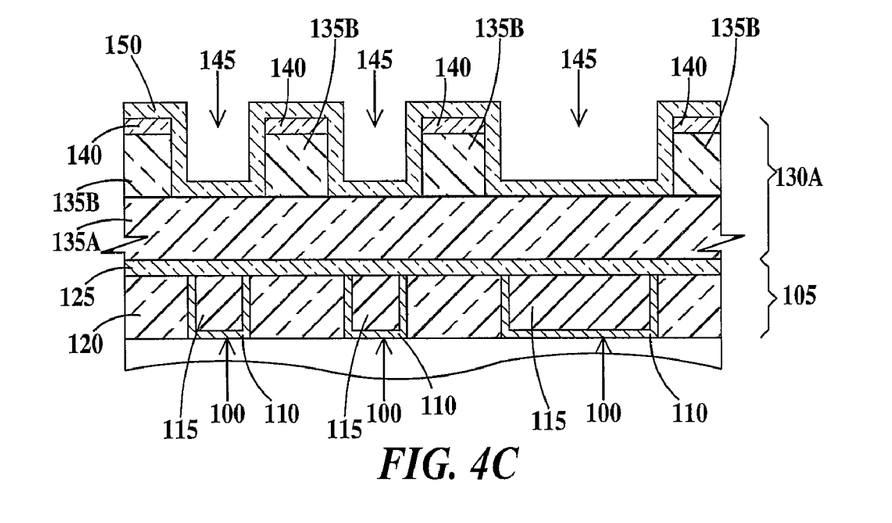

In FIG. 4C, sacrificial layer 150 comprises formed on the sidewalls and bottoms of wire trenches 145 and exposed capping layer 140. In one example, sacrificial layer 150 comprises $SiO_2$ formed by plasma enhanced chemical vapor deposition (PECVD) and is between about 5 nm to about 300 nm thick.

Figure 4D:
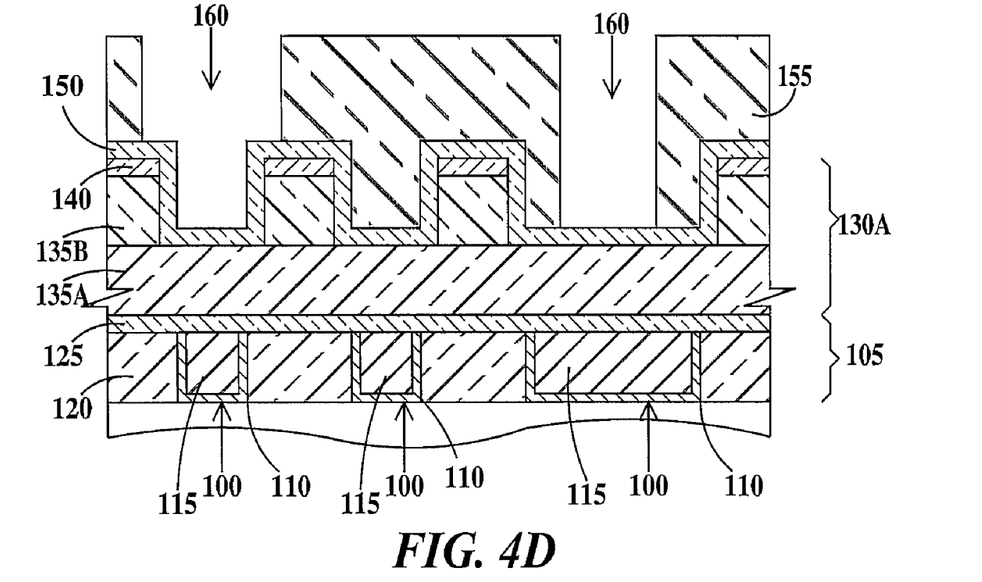

In FIG. 4D, photoresist layer 155 is formed over sacrificial layer 150 and openings 160 formed in the photoresist layer exposing the sacrificial layer in the bottom of the openings.

Figure 4E:
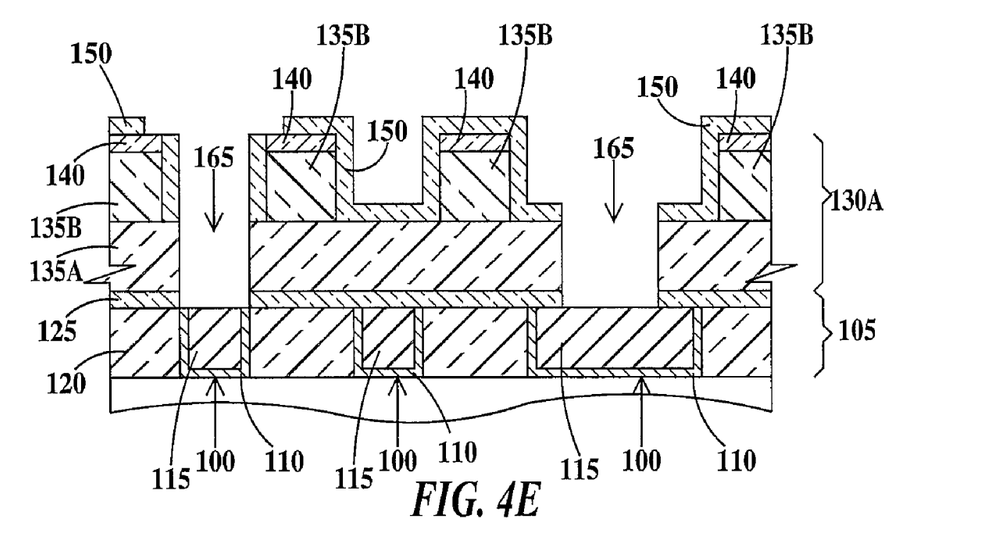

In FIG. 4E, the thus exposed sacrificial layer 150, lower dielectric later 135A and capping layer 125 are removed by RIE etching from the bottom of openings 160 (see FIG. 4D) to expose lower dielectric layer 135A. Then resist layer 155 (see FIG. 4D) is removed and via openings 165 formed through lower dielectric layer 135A and capping layer 125 to expose wires 100 in the bottom of the via openings.

Figure 4F:
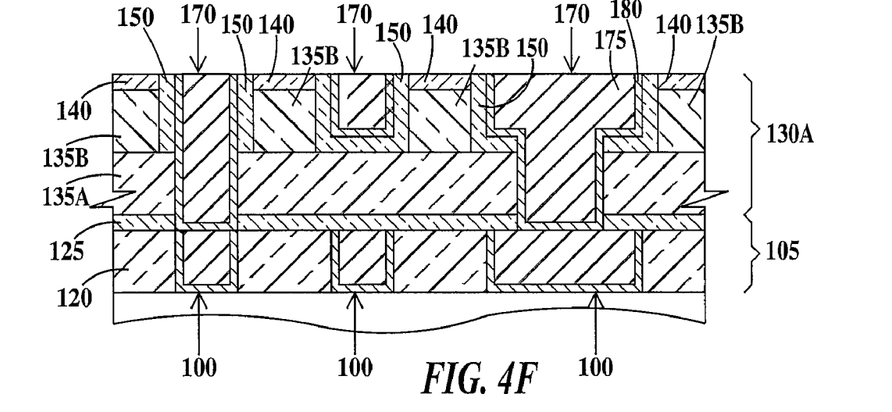

In FIG. 4F, wires 170 are formed, wires 170 including core conductors 175 and conductive liners 180, as described supra. Sacrificial layer 150 on top of capping layer 140 is also removed during the CMP. Note, that portions of sacrificial layer 150 are exposed at a surface 185 created by the CMP process.

Figure 4G:
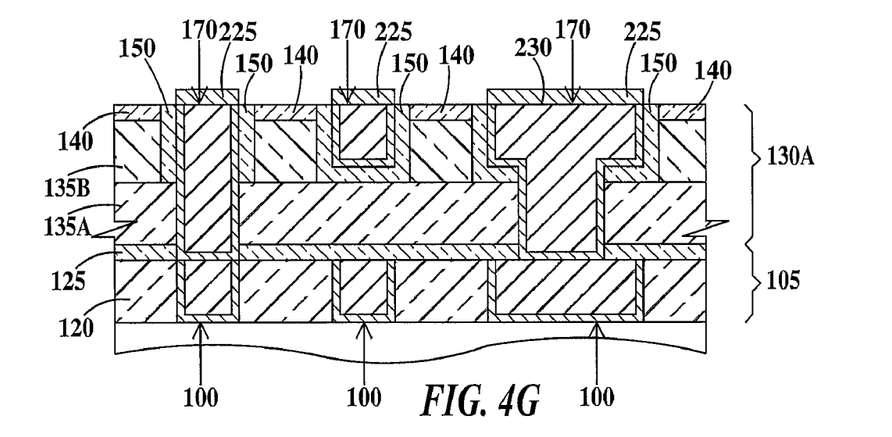

In FIG. 4G, a protective layer 225 is formed on exposed top surfaces 230 of wires 170. In one example, protective layer 225 is electroless deposited cobalt tungsten phosphide (CoWP) about 5 nm to about 100 nm thick.

Figure 4H:
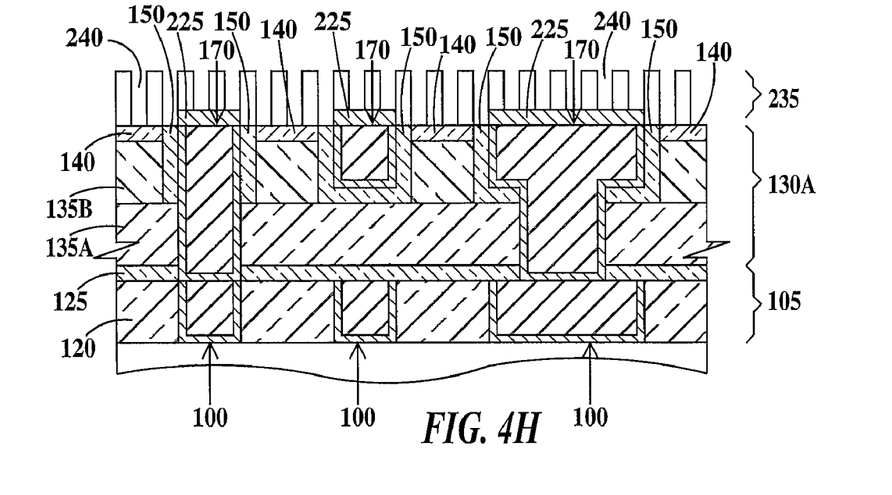

In FIG. 4H a block copolymer layer 235 is formed over protective layer 225, exposed capping layer 140 and exposed sacrificial layer 150. A block copolymer is a polymer containing alternating long sequences of two different polymers. Copolymer layer 235 is heated to drive of some or all of one polymer of the copolymer to form pores 240 in copolymer layer 235. Wherever pores 240 exist in copolymer layer 235, protective layer 225, capping layer 140 and sacrificial layer 150 are exposed in the bottom of the pore. In one example copolymer layer 235 comprises a polymethylmethacrylate {PMMA) in polystyrene (PS) copolymer and heating to between about 100° C. to about 400° C. drives off the PMMA polymer or portions thereof. Alternatively, the PMMA can be removed by use of a solvent that preferentially dissolves PMMA over PS. A top view of copolymer layer 235 with pores 240 is given in FIG. 5 and described infra.

Figure 4I:
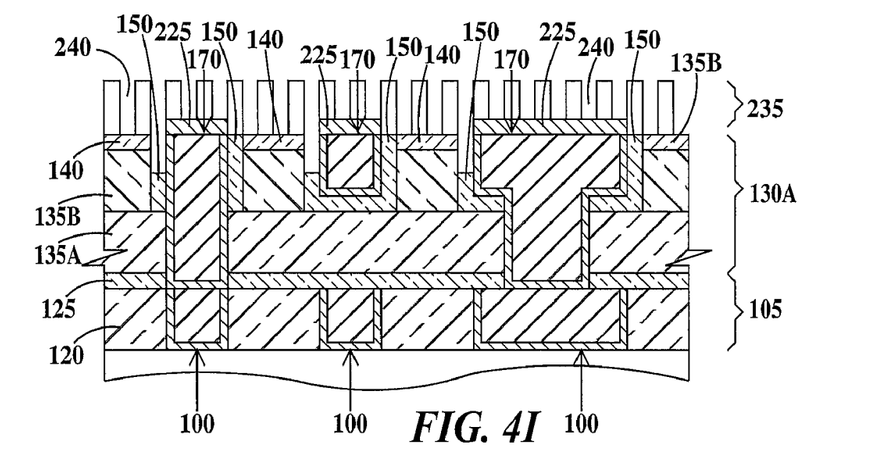

In FIG. 4I, a wet or RIE etch is performed to remove portions of sacrificial layer 150 exposed in the bottom of pores 240. In the example of sacrificial layer 150 being $SiO_2$, an aqueous HF containing etchant or a CF4 RIE process may be used.

Figure 4J:
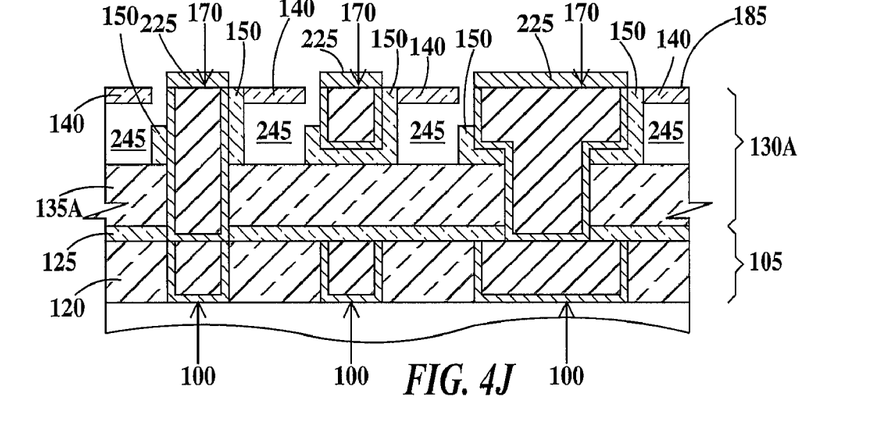

In FIG. 4J, copolymer layer 235 (see FIG. 4I) is removed and upper dielectric layer 135B (see FIG. 4I) is removed using an isotropic etch selective to upper dielectric layer 135B (see FIG. 4I) over lower dielectric layer 135A to form extended air-gaps 245. All (as illustrated in FIG. 4J) or some of upper dielectric layer 135B may be removed. As illustrated, extended air gaps 245 each include a first air-gap between capping layer 140 and wires 170 and a contiguous second air-gap where upper dielectric layer 135B (see FIG. 4I) existed before it was etched away, the first air-gaps having widths less than widths of the second air-gap. In the example that upper dielectric layer 135B (see FIG. 4I) is SiLK™ and lower dielectric layer 135A comprises SiCOH, a high-pressure RIE using $O_2$, $N_2$, $H_2$ or combinations thereof may be used. Capping layer 140 is supported by attachment to sacrificial layer 150.

Figure 4K:
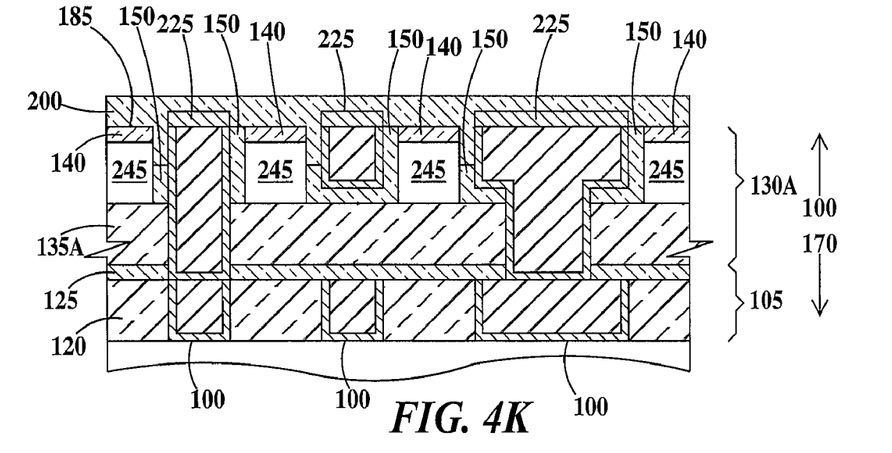

In FIG. 4K, sealing layer 200 is formed over surface 185, sealing extended air-gaps 245.

Figure 5:
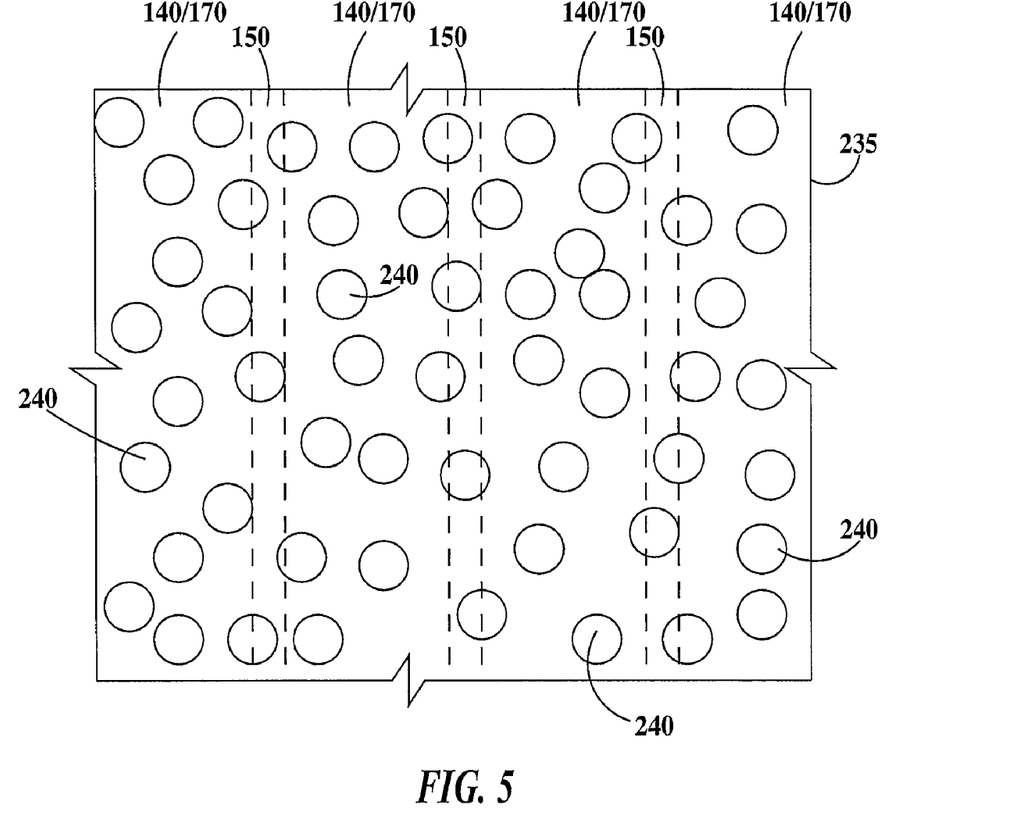
FIG. 5 is a top view illustrating the porosity of copolymer layer 235 as illustrated in FIG. 4H.

FIG. 5 is a top view illustrating the porosity of copolymer layer 235 as illustrated in FIG. 4H. In FIG. 5, stripes of sacrificial layer 150 are spaced between either capping layer 150 or wires 170 and pores 240 randomly distributed in copolymer layer 235. Wherever a pore overlaps sacrificial layer 150, the sacrificial layer is exposed in the bottom of the pore and may be etched away.

Figure 6A:
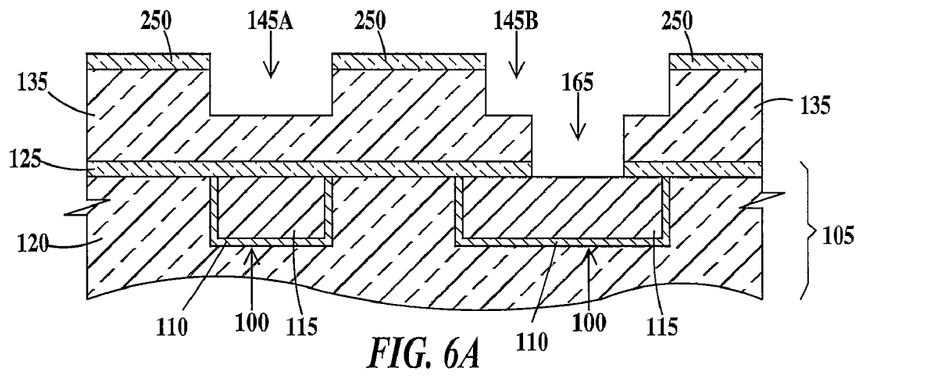
FIGS. 6A through 6G are partial cross-sectional views illustrating fabrication of an interconnect structure according to a fifth embodiment of the present invention.

FIGS. 6A through 6G are partial cross-sectional views illustrating fabrication of an interconnect structure according to a fifth embodiment of the present invention. In FIG. 6A, wires 100 are formed in first interconnect level 105. Wires 100 include core conductors 115 and conductive liners 110. First interconnect level 105 includes dielectric layer 120 (in which wires 100 are embedded) and capping layer 125 in contact with and covering wires 100 and dielectric layer 120. Formed top of first interconnect level 105 is dielectric layer 135. Formed on top of dielectric layer 135 comprises a hard mask layer 250. Materials and thicknesses for wires 100, dielectric layers 120 and 135 and capping layer 125 have been discussed supra. Hard mask layer may be formed from $SiO_2$, SiN, SiC, SiOC or SiON. Formed through hard mask layer 250 and part way through dielectric layer 135 are wire trenches 145A and 145B and formed in the bottom of wire trench 145B through the remaining thickness of dielectric layer 135 and through capping layer 125 comprises via opening 165. A wire 100 is exposed on the bottom of via opening 165.

Figure 6B:
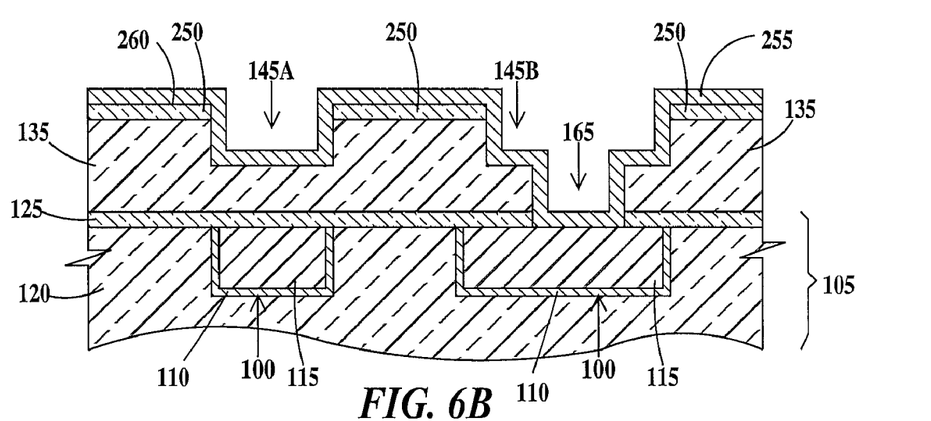

In FIG. 6B, a conformal sacrificial layer 255 is formed covering a top surface 260 of hard mask layer 250 and the sidewalls and bottom of wire trenches 145A and 145B and via opening 165. In one example sacrificial layer 255 is tungsten and is about 5 nm to about 300 nm thick.

Figure 6C:
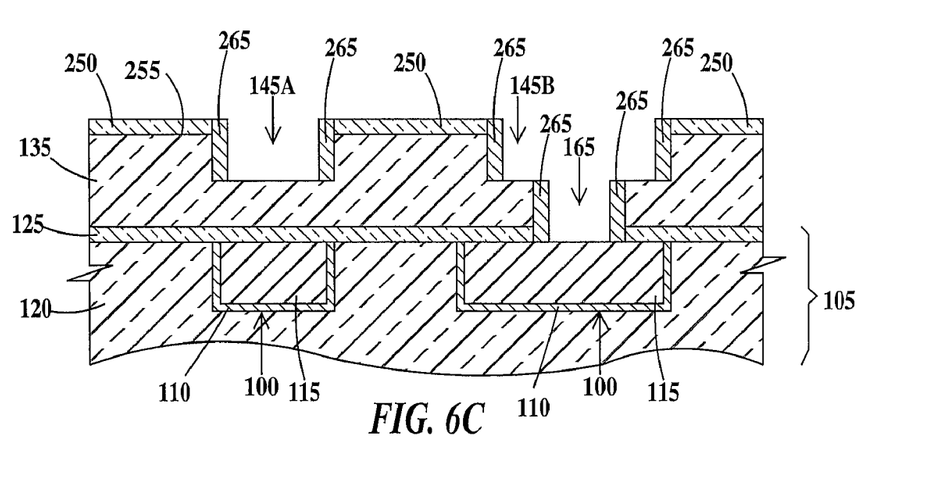

In FIG. 6C, an RIE process is performed to remove tungsten from top surface 260 of hard mask layer 250 and the bottoms of wire trenches 145A and 145B and via opening 165 leaving spacers 265 on the sidewalls of the wire trenches and via opening. In the example that dielectric layer 135 comprises SiLK™, the RIE process may use CF4 and $O_2$ with a high bias voltage which selectively etches tungsten over SiLK™. Alternatively, the structure illustrated in FIG. 6C can be formed directly from the structure illustrated in FIG. 6A, by direct deposition of tungsten on the sidewalls of wire trenches 145A and 145B and via opening 165 using ionized plasma PVD tuned for a high sputter rate.

Figure 6D:
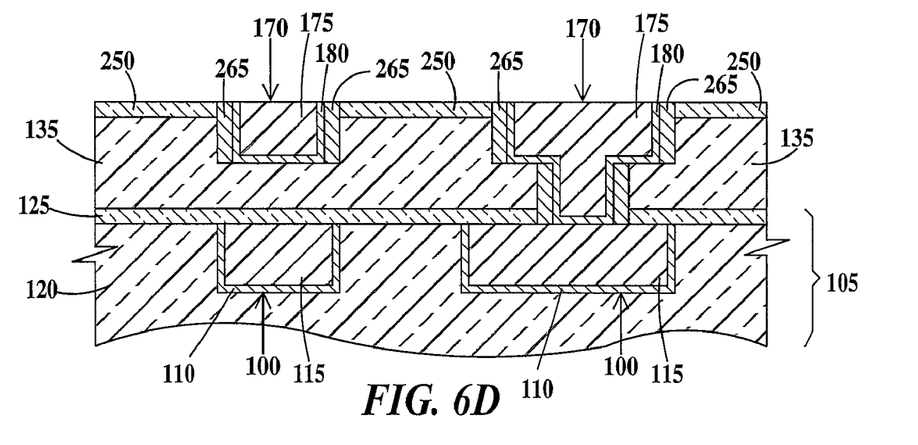

In FIG. 6D, wires 170, including core conductors 175 and conductive liners 180, are formed as described supra.

Figure 6E:
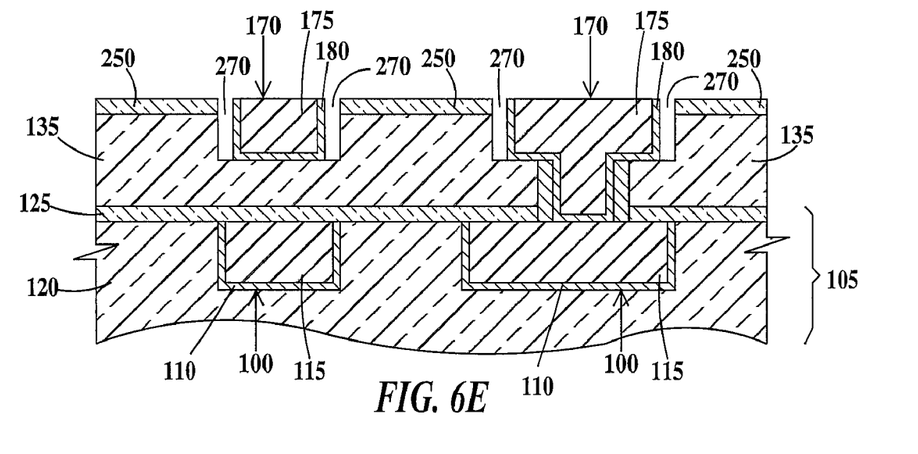

In FIG. 6E, spacers 265 (see FIG. 6D) are removed from the side of wires 170 to form air-gaps 270 using, for example, an aqueous $H_2O_2$ solution. Air gaps 270 each include a first air-gap between capping layer 140 and wires 170 and a contiguous second air-gap between dielectric layer 135 and wires 170, both the first and second air-gaps having about the same width. Any etch process known in the art that will etch tungsten but not wires 170 may be used.

Figure 6F:
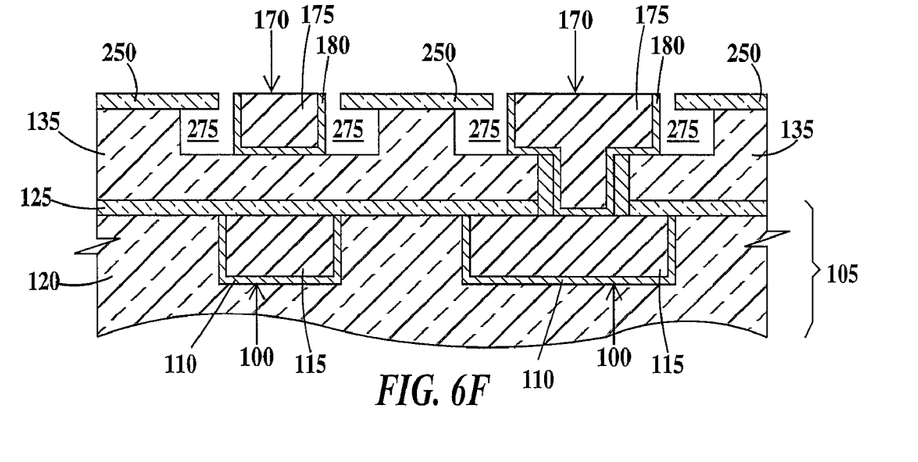

In FIG. 6F, dielectric layer 135 is isotropically etched to form extended air-gaps 275 under hard mask layer 250 adjacent to wires 170. Extended air gaps 275 each include a first air-gap between capping layer 140 and wires 170 and a contiguous second air-gap between dielectric layer 135 and wires 170, the first air-gaps having widths less than widths of the second air-gaps. In one example, if dielectric layer 135 comprises SiLK™ and hard mask layer 250 comprises SiC, dielectric layer 135 may be RIE etched using $O_2$, $N_2$, $H_2$ or a mixture thereof, which selectively etches SiLK™ over SiC.

Figure 6G:
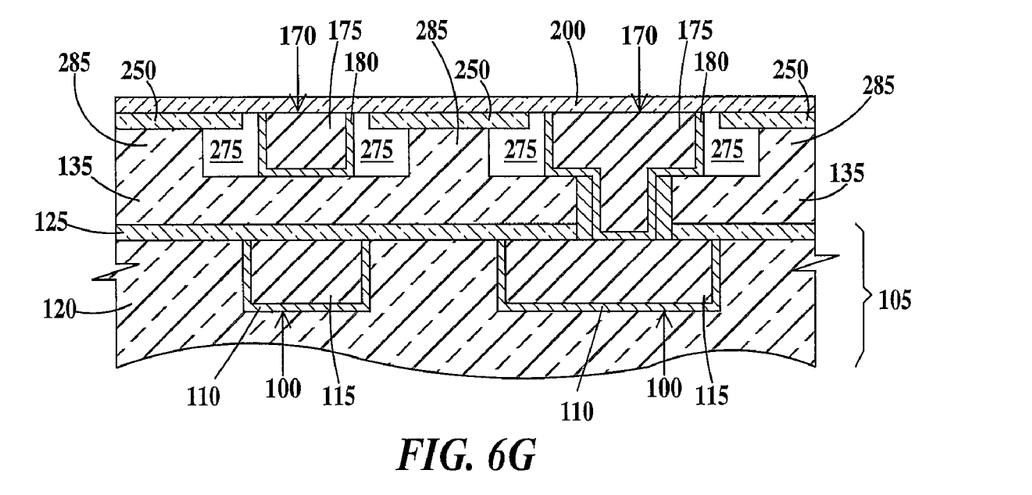

In FIG. 6G, capping layer 200 is formed (as described supra) over hard mask layer 250 sealing extended air-gaps 275. Note, pillars 285 of dielectric layer 135 remain in contact with a bottom surface of wires 170.

Figure 7:
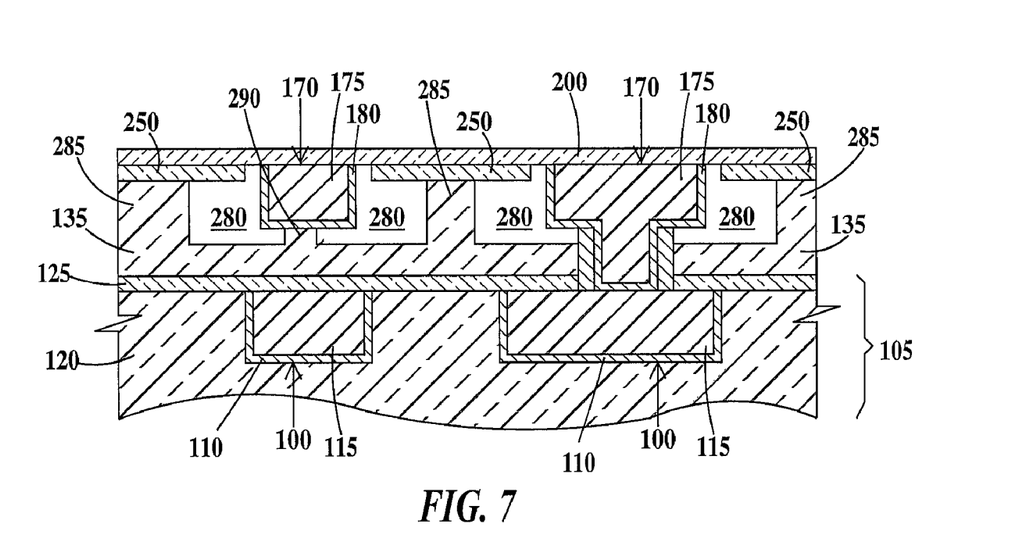
FIG. 7 is a partial cross-section illustrating an air-gap extending under conductive lines.

FIG. 7 is a partial cross-section illustrating an air-gap extending under wires 170. By over etching dielectric layer 135, extended air-gaps 280 are formed which extend under wires 170, but pillars 290 of dielectric layer 135 remain in contact with a bottom surface of wires 170 (where there is not an integral via as described supra). Over etch of dielectric layer 135 may be applied to all embodiments of the present invention to extend the various air-gaps under wires 170 except the fourth embodiment.

Thus the present invention provides interconnection structures and methods of fabricating interconnection structures that are less sensitive to RC delay.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the first, second, third and fifth embodiments of the present invention may be adapted to utilize the dual layers of dielectric of the fourth embodiment of the present invention, including the dual layer comprising SiLK™ over SiCOH. Therefore, it is intended that the following claims cover all such modifications and changes as fall within the true spirit and scope of the invention.

What is claimed is:

1. A structure, comprising:
a dielectric layer on a substrate;
a capping layer formed on a top surface of said dielectric layer;
a damascene or dual damascene wire extending below said top surface of said dielectric layer, a top surface of said damascene or dual damascene wire coplanar with a top surface of said capping layer;
a first air-gap having a first side defined by a first region of sidewalls of said a damascene or dual damascene wire, a second side defined by sidewalls of said capping layer and a top defined by a bottom surface of a sealing layer, said sealing layer on said top surface of said damascene or dual damascene wire and said top surface of said capping layer, said sealing layer bridging across and sealing a top of said first air-gap; and
a second air-gap having a first side defined by a second region of said sidewalls of said damascene or dual damascene wire and having a second side defined by a sidewall of said dielectric layer, a bottom of said first air-gap open to a top of said second air gap.

2. The structure of claim 1, wherein said first air-gap has a first width and said second air-gap has a second width, said first and second widths measured parallel to a top surface of said substrate, said first width different than said second width.

3. The structure of claim 1, wherein said second air-gap extends under said capping layer, and a pillar of dielectric layer supports said capping layer.

4. The structure of claim 1, wherein said second air-gap extends to or below a bottom surface of said damascene or dual damascene wire and a pillar of said dielectric layer supports said damascene or dual damascene wire.

5. The structure of claim 1, wherein said sealing layer comprises a material selected from the group consisting of silicon nitride, silicon carbide silicon oxynitride and silicon oxycarbide.

6. The structure of claim 1, wherein said dielectric layer comprises one or more layers, each of said one or more layers comprising a different material selected from the group consisting of hydrogen silsesquioxane polymer, methyl silsesquioxane polymer, poly(arylene) ether, and methyl doped silica glass.

7. The structure of claim 1, wherein said capping layer comprises a material selected from the group consisting of silicon nitride, silicon carbide silicon oxynitride, silicon carbo nitride and silicon oxycarbide.

8. The structure of claim 1, further including:
an isolated region of a sacrificial layer below said top surface of and embedded in said dielectric layer and abutting a bottom surface of said damascene or dual damascene wire and said dielectric layer.

9. The structure of claim 8, wherein said sacrificial layer comprises a material selected from the group consisting of silicon oxide and tungsten.

10. The structure of claim 1, further including:
a portion of a sacrificial layer used in the fabrication of said structure between a portion of said sidewall of said damascene or dual damascene wire and said dielectric layer.

11. The structure of claim 1, wherein said damascene or dual damascene wire comprises a copper core, a tantalum layer on sides and a bottom surface of said copper core, and a tantalum nitride layer on sides and a bottom surface of said tantalum layer.

12. The structure of claim 1, further including:
an additional damascene or dual damascene wire, said second air-gap extending between opposing sidewalls of said damascene or dual damascene wire and said additional damascene or dual damascene wire.

13. The structure of claim 12, further including:
a portion of a sacrificial layer used in the fabrication of said structure on portions of sidewalls and bottom surfaces of said damascene or dual damascene wire and said additional damascene or dual damascene wire.

14. The structure of claim 1, further including:
a protective layer on said top surface of said damascene or dual damascene wire but not on said top surface of said capping layer.

15. The structure of claim 14, wherein said protective layer comprises cobalt tungsten phosphide.

16. The structure of claim 1, wherein said dielectric layer comprises a dielectric material having a dielectric constant than a lower dielectric constant of undoped thermal $SiO_2$.

17. The structure of claim 1, wherein said second air-gap extends under said capping layer, and a pillar of dielectric layer supports said capping layer, a bottom surface of said capping layer defining regions of said top of said second air-gap not open to said bottom of said first air-gap.

18. The structure of claim 1, further including:
an isolated region of a sacrificial layer embedded below said top surface of and in said dielectric layer and abutting sidewalls of said damascene or dual damascene wire, said damascene or dual damascene wire extending through said isolated region of said sacrificial layer.

19. The structure of claim 18, wherein said sacrificial layer comprises a material selected from the group consisting of silicon oxide and tungsten.

20. The structure of claim 1, wherein said dielectric layer consists of a single layer.

\* \* \* \* \*